US007466546B2

(12) United States Patent  
Park

(10) Patent No.: US 7,466,546 B2  
(45) Date of Patent: Dec. 16, 2008

(54) FLAT DISPLAY DEVICE AND COOLING APPARATUS FOR THE SAME

(75) Inventor: Sang Don Park, Daegu (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 11/505,825

(22) Filed: Aug. 18, 2006

(65) Prior Publication Data

US 2007/0103866 A1    May 10, 2007

(30) Foreign Application Priority Data

Nov. 4, 2005   (KR) .................. 10-2005-0105179

(51) Int. Cl.
*H05K 7/20* (2006.01)
*F04D 5/00* (2006.01)
*H04N 5/74* (2006.01)

(52) U.S. Cl. .............. 361/695; 361/692; 361/694; 454/184; 348/748; 345/60; 345/905; 415/53.1

(58) Field of Classification Search ......... 361/694–695; 165/80.3, 104.33, 121–122; 454/184; 415/53.1–53.3, 415/212.1; 345/60, 905; 348/748; 313/46; 349/161

See application file for complete search history.

(56) References Cited

U.S. PATENT DOCUMENTS

| 3,177,794 | A | | 4/1965 | Laing | 454/121 |
| 5,038,577 | A | * | 8/1991 | Stanford | 62/262 |
| 5,497,573 | A | * | 3/1996 | Stadjuhar et al. | 40/564 |
| 5,735,137 | A | * | 4/1998 | Kim | 62/410 |
| 5,787,717 | A | * | 8/1998 | Bang | 62/89 |
| 5,788,569 | A | * | 8/1998 | Lee | 454/233 |
| 5,788,570 | A | * | 8/1998 | Cho | 454/233 |
| 5,807,170 | A | * | 9/1998 | Lee | 454/233 |
| 5,869,919 | A | * | 2/1999 | Sato et al. | 313/17 |
| 6,511,291 | B2 | | 1/2003 | Koochingchai | 425/229 |
| 6,571,340 | B1 | * | 5/2003 | Lee | 713/300 |
| 2003/0202880 | A1 | | 10/2003 | Koochingchai | 415/229 |
| 2004/0223299 | A1 | * | 11/2004 | Ghosh | 361/687 |
| 2005/0056037 | A1 | * | 3/2005 | Park et al. | 62/262 |
| 2005/0056038 | A1 | * | 3/2005 | Park et al. | 62/262 |
| 2005/0056039 | A1 | * | 3/2005 | Kim et al. | 62/262 |
| 2005/0105012 | A1 | | 5/2005 | Kim et al. | 349/58 |
| 2005/0168942 | A1 | * | 8/2005 | Steinbrecher | 361/690 |
| 2005/0284170 | A1 | | 12/2005 | Lee et al. | 62/419 |
| 2006/0082271 | A1 | * | 4/2006 | Lee et al. | 313/35 |
| 2006/0164804 | A1 | * | 7/2006 | Kim et al. | 361/688 |
| 2006/0199514 | A1 | * | 9/2006 | Kimura | 454/237 |

(Continued)

FOREIGN PATENT DOCUMENTS

JP        04048693 A   *  2/1992

(Continued)

*Primary Examiner*—Jayprakash N Gandhi
*Assistant Examiner*—Robert J Hoffberg
(74) *Attorney, Agent, or Firm*—Ked & Associates, LLP

(57) ABSTRACT

There is provided a cooling apparatus for a flat display device. The cooling apparatus includes a flat display module, a cover for protecting an exterior of the flat display module, an air inlet formed on one side of the cover, for introducing external air, an air outlet formed in the other side of the cover, for discharging high temperature air contained inside the cover, and a shield for selectively closing the air outlet to prevent inflow of foreign substances.

28 Claims, 5 Drawing Sheets

U.S. PATENT DOCUMENTS

| | | | |
|---|---|---|---|
| 2007/0103863 A1* | 5/2007 | Kim | 361/687 |
| 2007/0103864 A1* | 5/2007 | Kim | 361/687 |
| 2007/0103865 A1* | 5/2007 | Kim | 361/694 |
| 2007/0103866 A1* | 5/2007 | Park | 361/695 |
| 2007/0103909 A1* | 5/2007 | Park | 362/294 |

FOREIGN PATENT DOCUMENTS

| | | |
|---|---|---|
| JP | 2000-124624 A | 4/2000 |
| JP | 2000-307281 A | 11/2000 |

* cited by examiner

FLAT DISPLAY DEVICE AND COOLING APPARATUS FOR THE SAME

BACKGROUND OF THE INVENTION

1. Field of the Invention

The present invention relates to a flat display device, and more particularly, to a cooling apparatus for a flat display device, capable of preventing foreign substances such as dusts from entering the inside of the flat display device, and preventing contamination caused by air flowing into the inside of the flat display device.

2. Description of the Related Art

Unlike a cathode ray tube (CRT), a flat display uses a driving circuit arranged in a matrix pattern to differently excite pixels and thus realize an image. Recently, the flat display device has been widely used as it has advantageous in that it takes up a relatively small space. A variety of flat display modules such as a liquid crystal display (LCD), a field emission display (FED), a plasma display panel (PDP), and an electro-luminescence (EL) have been applied to the flat display device.

The flat display device using the flat display module is reduced in a thickness as compared with the CRT. However, since a large number of heat-generating components must be incorporated in a narrow space of the display device, the heat, which is generated by the heat-generating components in the flat display device during the operation of the flat display module, must be effectively dissipated to an external side.

Particularly, in the case of the PDP, since the image is realized by electric discharge of discharge gas, high temperature heat is generated. Therefore, if the high temperature heat is not quickly dissipated, the display device may malfunction. Needless to say, in the case of other types of flat display devices, the heat dissipation performance is very important fact determining the quality thereof.

In order to dissipate the heat, a plurality of holes are formed on a cover of the flat display device so that cool air can be inhaled and discharged through the holes. The plurality of holes are formed ubiquitously on a cover of the flat display device so that the inner portion of the flat display device can be totally cooled. Furthermore, in some cases, a discharging fan is installed at the outlet of the flat display device so as to enhance the speed of the discharging air.

However, since dirt and dust are inhaled with the inhaled air together and accumulated at some places in the flat display device, when the cool air is inhaled into the flat display device, bringing about malfunction of the flat display device. Furthermore, the accumulated dirt and dust can bring about a fire in the flat display device, when the heat does not be exhausted at the portion in which the dirt and dust are accumulated. The problem regarding the dirt and dust is fatal in the environment with high pollution density, for example subway or underground space.

Furthermore, a plurality of holes through which the air is exhausted and introduced are formed on the back cover. The holes of the back cover deteriorate strength of the back cover. Therefore, the back cover must be enough thick. In this case, the manufacturing cost increases.

SUMMARY OF THE INVENTION

Accordingly, the present invention is directed to a flat display device and a cooling apparatus for the same that substantially obviate one or more problems due to limitations and disadvantages of the related art.

An object of the present invention is to provide a flat display device and a cooling apparatus for the same, capable of achieving stable performance of the flat display device and removing danger caused by a fire by removing contamination caused by foreign substances.

Another object of the present invention is to provide a flat display device and a cooling apparatus for the same, capable of enhancing strength of the flat display device and reducing manufacturing costs by omitting communication holes formed over a wide range of a cover of the flat display device.

Still another object of the present invention is to provide a cooling apparatus for the flat display device, for allowing the flat display device to stably operate for a long time by effectively preventing foreign substances from flowing into the inside of the flat display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a cooling apparatus for a flat display device, including: a flat display module; a cover for protecting an exterior of the flat display module; an air inlet formed on one side of the cover, for introducing external air; an opening in a back cover, formed on the other side of the cover, for discharging high temperature air contained inside the cover; and a shield for selectively closing the opening in the back cover to prevent inflow of foreign substances.

In another aspect of the present invention, there is provided a flat display device including: a flat display module; a cover for protecting an exterior of the flat display module; an air inlet formed in one side of the cover, for introducing external air; an air outlet formed in one peripheral portion of the cover, for discharging air contained inside the cover; a fan for forcibly ventilating air from the air inlet to the outlet; and a filter for filtering foreign substances flowing through the air inlet.

In still another aspect of the present invention, there is provided a cooling apparatus for a flat display device, including: a flat display module; a cover for protecting an exterior of the flat display module; an air inlet formed on one side of the cover, for introducing external air; an air outlet, formed on the other side of the cover, for discharging high temperature air contained inside the cover; a fan for allowing the air inlet to introduce external air and forcibly ventilating high temperature air contained inside the cover to the air outlet; and a filter aligned with the air inlet, for filtering foreign substances flowing through the air inlet, wherein the air outlet is opened when the fan operates and closed when the fan stops.

According to the present invention, a cooling efficiency for a flat display device improves, inflow of foreign substances to the inside of the flat display device is prevented, reliability and stability of an operation improve, and cost reduction is achieved.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
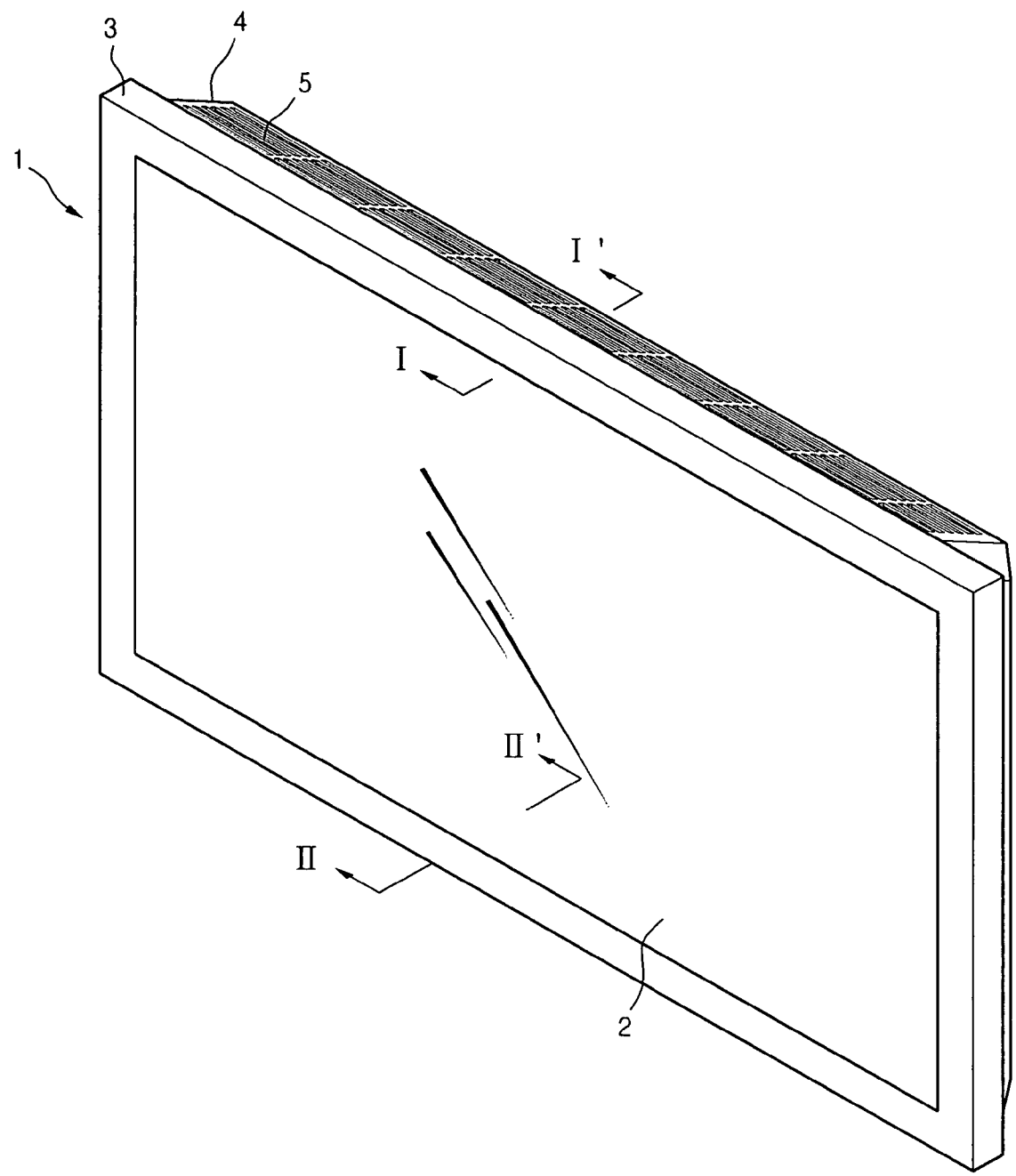
FIG. 1 is a perspective of a flat display device according to the present invention.

FIG. 1 is a perspective view of a flat display device according to an embodiment of the present invention.

Referring to FIG. 1, a flat display device 1 of this embodiment includes a flat display module 2, a front cover 3 for supporting and protecting a front portion of the flat display module 2, and a back cover 4 for supporting and protecting a rear portion of the flat display module 2. An air outlet 5 through which internal hot air of the flat display device 1 is exhausted is formed on an upper periphery of the back cover 4. The air outlet 5 has a plurality of slits. The slits are arranged not to deteriorate strength of the back cover 4. That is, the slits are collected in an area of the air outlet 5.

The flat display module 2 may be selected from the group consisting of an LCD, an FED, a PDP, and an EL. Preferably, the flat display module 2 may be the PDP generating a large amount of heat.

The front and back covers 3 and 4 define a space for receiving the flat display module 2 and protect components disposed in the space. The front and back covers 3 and 4 are independent parts that are assembled with each other. However, the present invention is not limited to this case. For example, the front and rear covers 3 and 4 may be integrated with each other as a single body as far as they can protect the front and rear portions of the display device. There is a predetermined gap between a heat generating component provided on a surface of the flat display module 2 and an inner surface of the back cover 4 so that air flows through the gap to cool the heat generating component and is then exhausted through the air outlet 5.

The operation of a cooling apparatus of the present invention will now be described with reference to the above flat display device.

When the flat display device 1 operates, a large amount of heat is generated in the flat display module 2. At this point, the hot air generated from the heat generating component disposed on the rear surface of the flat display module 2 is cooled by the incoming air. Then, the hot air flows upward and is then exhausted through the air outlet 5. This is the natural convection for exhausting the hot air out of the flat display device, thereby improving the cooling efficiency. At this point, it is more preferable to allow outer air to be introduced through an overall area of the bottom portion of the flat display device 1 and exhausted through the air outlet 5 via an overall area of the rear portion of the display device.

Because of the air flow system, additional air holes through which air flows do not formed on the rear surface of the back cover 4, and filter members can be limitedly installed at the air passing portion, for example air outlet and air inlet. Furthermore, since a rear surface of the back cover can be contact with the wall, the installation of the flat display device does not need small space and is done more conveniently.

Furthermore, the air outlet 5 is provided on an inclined portion of the back cover so that the hot air can be exhausted upward and thus the hot air can more effectively flow.

In addition, since the front surface of the flat display module 2 is exposed to the external side, the heat generated from the front portion of the display module 2 can be quickly dissipated by the natural convention of the outer air.

Figure 2:
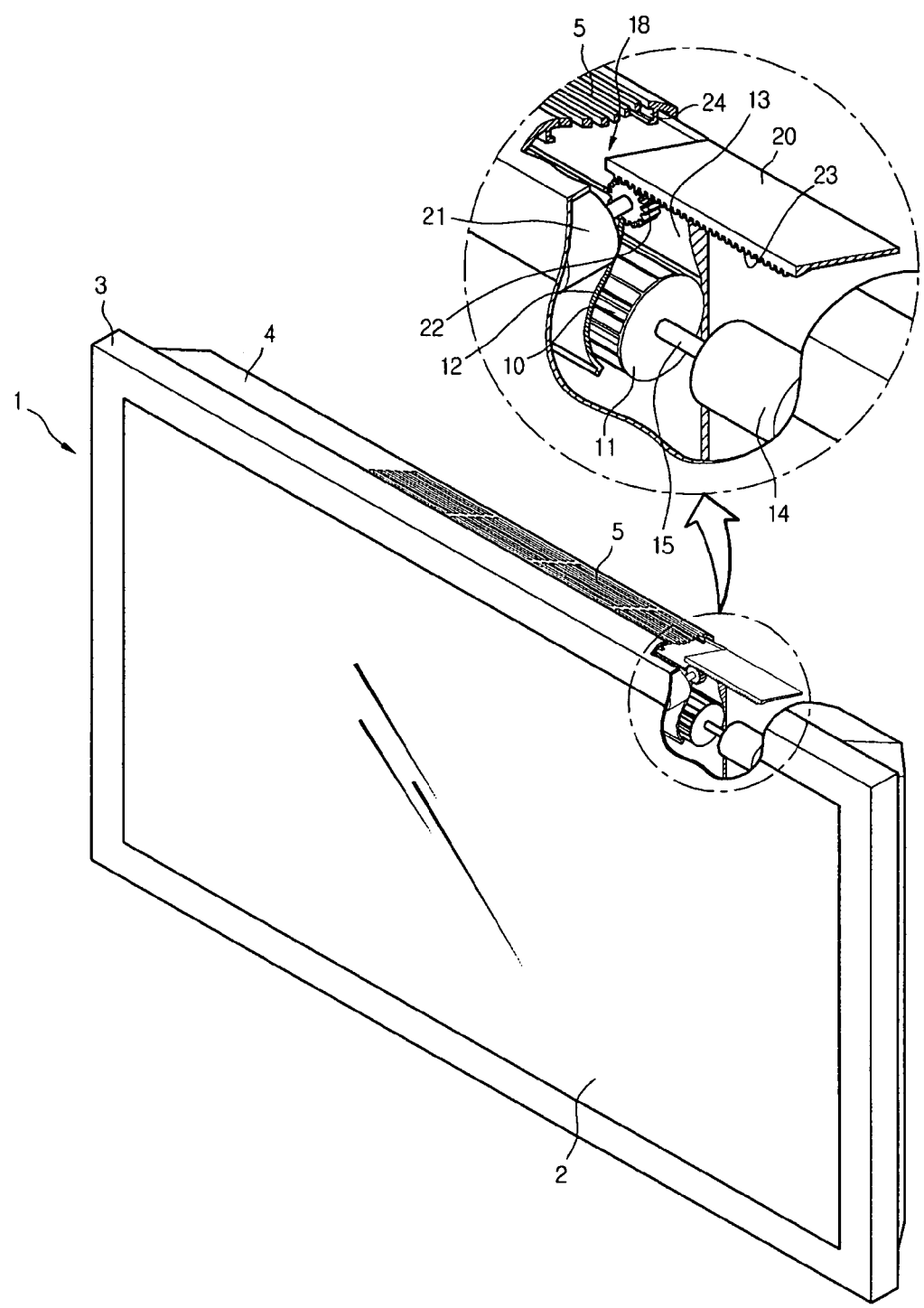
FIG. 2 is a partially broken perspective view of the flat panel display of FIG. 1.

FIG. 2 is a partially broken perspective view of the flat panel display of FIG. 1.

Referring to FIG. 2, a cross-flow fan 7 is installed in an inner portion of the air outlet 5 in the back cover 4 in a longitudinal direction of the flat display device 1. By the cross-flow fan 7, the top surface of the back cover 4 provides an area through which the internal hot air is exhausted to the external side. Since the hot air can be exhausted through the top surface of the back cover 4, the air exhaust can be more effectively realized to reduce airflow resistance and airflow noise.

Describing the cross-flow fan 7 in more detail, the cross-flow fan 7 includes an impeller 10 disposed in the longitudinal direction of the back cover 4 and a circular plate 11 for dividing the impeller 10 by a predetermined interval and enhancing strength of the impeller. A driving shaft 15 and a motor 14 connected to the driving shaft 15 are further provided to one end of the cross-flow fan 7. A rotational force of the motor 14 is transferred to the cross-flow fan via the driving shaft 15.

The impeller 10 is disposed in a housing 18 to guide the airflow when the impeller 10 rotates. The housing 18 includes a scroll 12 disposed in front of the impeller 10 and spaced apart from the impeller 10 and a stabilizer 13 disposed in rear of the impeller 10 and spaced apart from the impeller 10. The impeller 10 rotates clockwise in the drawing.

A shield 20 for selectively shielding the air outlet 5 is located right inside the air outlet 5. The shield 20, installed in the right inside of the air outlet 5, opens the air outlet 5 when the cross-flow fan 7 operates to allow air ventilated from the cross-flow fan 7 to be discharged, and closes the air outlet 5 when the cross-flow fan 7 does not operate to allow inflow of external air and foreign substances to be blocked.

Construction of the shield 20 will be described in more detail. The shield includes a plate-shaped member moving horizontally. The shield is at least larger than the air outlet 5. Also, position movement of the shield 20 is guided by a shield guide 24 formed on the inner surface of the back cover 4. An operation structure allowing the shield 20 to be moved horizontally, includes a rack 23 formed on the lower surface of the shield 20, a pinion 22 engaged with the rack 23, and a driving motor 21 connected to the pinion 22. Here, the pinion 22 and the motor 21 may be fixed in a predetermined location of the back cover 4 or the front cover 3.

The construction of the shield 20 is not limited to the above description, and other constructions may be used. As far as the air outlet 5 can be selectively opened by the shield 20, any construction may be fall within the spirit of the present invention.

Structures of the air inlet through which external air is introduced and the air outlet through which hot air of the inside is discharged will be described in detail with reference to related sectional views.

Figure 3:
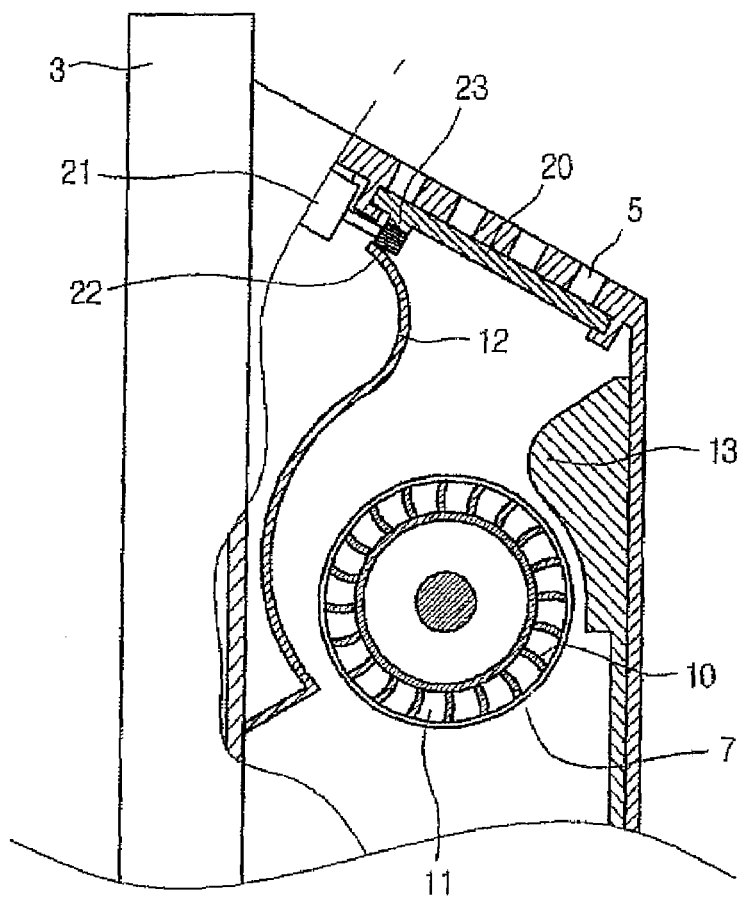
FIG. 3 is a sectional view along a line I-I' of FIG. 1.

FIG. 3 is a sectional view along a line I-I' of FIG. 1.

Referring to FIG. 3, when the cross-flow fan 7 rotates clockwise as described above, air inside the back cover 4 moves upward and moves along a scroll 12, and is then discharged to the outside through the air outlet 5.

Since the cross-flow fan 7 and the air outlet 5 are provided long in a longitudinal direction of the upper surface of the back cover, a large amount of hot air may be discharged. Increase in a discharge area of hot air may decreases resistance in air discharge and reduces airflow noises. Furthermore, since the hot air is exhausted through the top surface of the back cover 4, there is no need to provide a gap between a wall on which the display device is installed and a rear surface of the back cover 4. Therefore, the flat panel display device can closely be installed on the wall, thereby taking up a relatively small space.

Also, since air that has moved upward is directly discharged to the outside, maintaining a moving direction, airflow inside the flat display device may be performed more swiftly.

Figure 4:
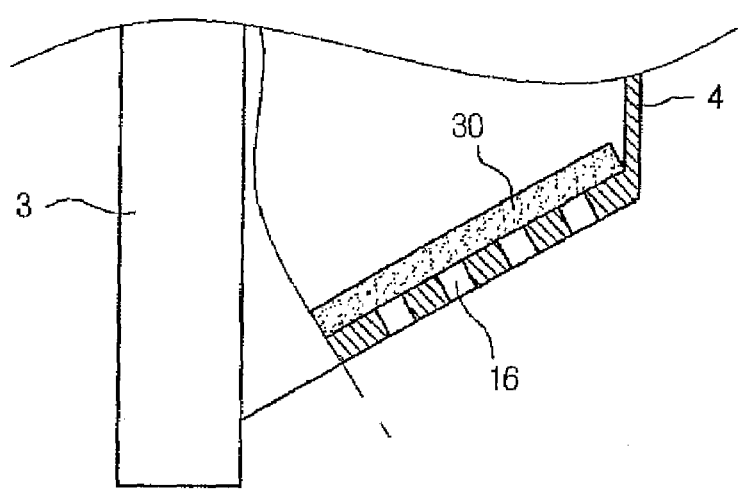
FIG. 4 is a sectional view along a line II-II' of FIG. 1.

FIG. 4 is a sectional view along a line II-II' of FIG. 1.

Referring to FIG. 4, a side air inlet 16 for introducing external air is formed in the lower end of the back cover 4, and a filter 30 is installed on the inner surface of the side air inlet 16. The filter 30 covers an entire portion where the side air inlet 16 is formed to filter foreign substances introduced from the outside.

Referring to FIGS. 3 and 4, foreign substances contained in air that has introduced into the flat display device 1 are filtered by the filter 30, and foreign substances do not flow into the flat display device through the air outlet 5 when the flat display device 1 does not operate. Therefore, the inside of the flat display device 1 may be maintained at a foreign substances-free clean state.

Therefore, since the flat display device according to the present invention may maintain its inside at a foreign substances-free state, reliability of the flat display device improves, a problem caused by heat emission improves, and a danger of a fire is removed.

Furthermore, a flat display device may stably operate for a long time even when the flat display device is used in dusty environments such as a subway and a public place.

Figure 5:
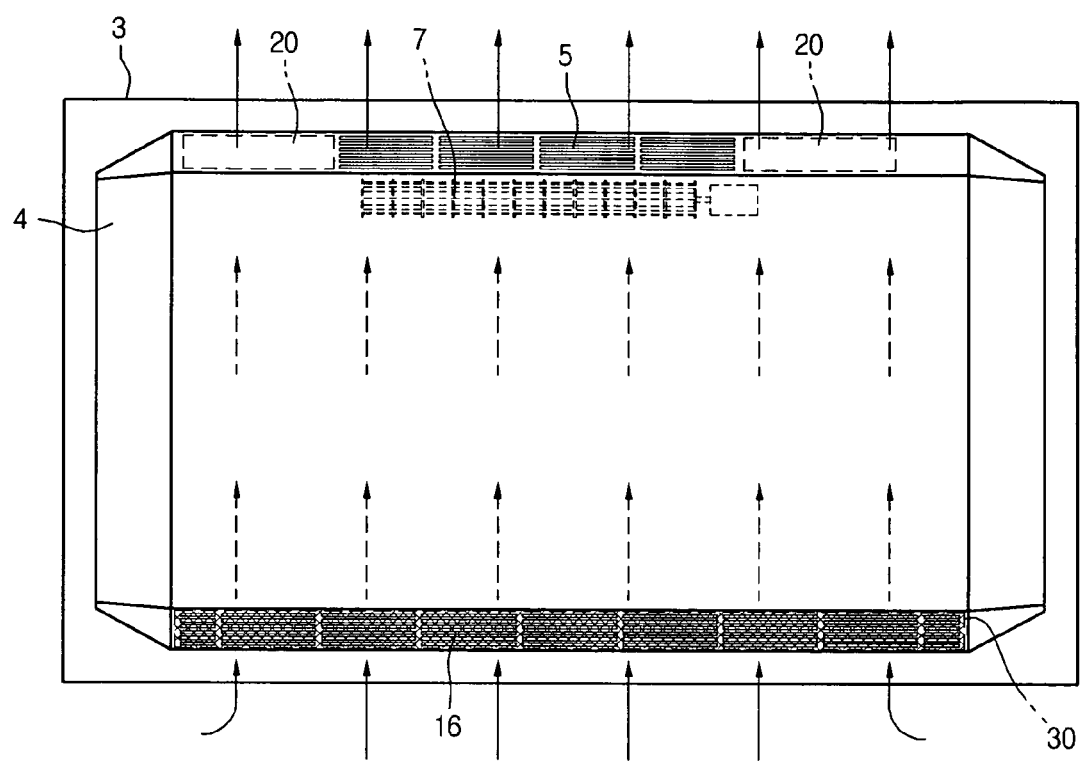
FIG. 5 is a rear view of the flat display device of FIG. 1.

FIG. 5 is a rear view of the flat display device of FIG. 1.

Referring to FIG. 5, the back cover 4 is further provided with an air inlet 16 through which air inhales.

The air inlet 16 is formed on an inclined portion of the lower periphery of the back cover 4 to introduce external cool air into the flat display device. The cool air introduced through the lower air inlet 16 compensates for the hot air exhausted through the air outlet 5. That is, the cool air introduced compensates for a negative pressure generated by the natural convection and a negative pressure generated by the air exhausted through the air outlet 5.

The cool air introduced through the lower air inlet 16 cools the components provided on the rear surface of the flat display module 2 and is then exhausted through the air outlet 5 via the cross-flow fan 7.

The air inlet 16 is preferably formed along the overall longitudinal length of the lower periphery of the back cover 4 so that the components can be uniformly cooled. Arrows in the drawing indicates the airflow direction.

The cross-flow fan 7 is formed along the longitudinal direction at the top surface of the back cover 4. Therefore, the cool air introduced through the lower air inlet 16 flows upward, in the course of which the components is cooled, and is then exhausted through the upper air outlet.

Some of the components (i.e., a power unit) generate high temperature heat and some of the components (i.e., tape carrier package chip (TCP)) require a low temperature condition.

In order to meet the operational condition for each component, it is preferable that the components that require the thermal stability are disposed close to the lower air inlet 16 so that they can be quickly cooled by the cool air introduced. In addition, the components generating a large amount of heat is preferably disposed close to the cross-flow fan 7 so that the heat generated by the components can be quickly dissipated without affecting on other circuits.

As described above, since the cross-flow fan can be disposed along the one peripheral surface of the back cover 4, the internal hot air of the back cover can be quickly exhausted, thereby improving the heat dissipation efficiency and operational reliability of the flat display device.

Meanwhile, the air outlet is provided with a shield 20 to selectively open or close the air outlet 5 therein, and the air inlet 16 is provided with a filter 30 filtering the inhaled air. Therefore, dirt and dust do not been inhaled into the flat display device, when the flat display device operates, thereby providing a stable operation of the flat display device.

Figure 6:
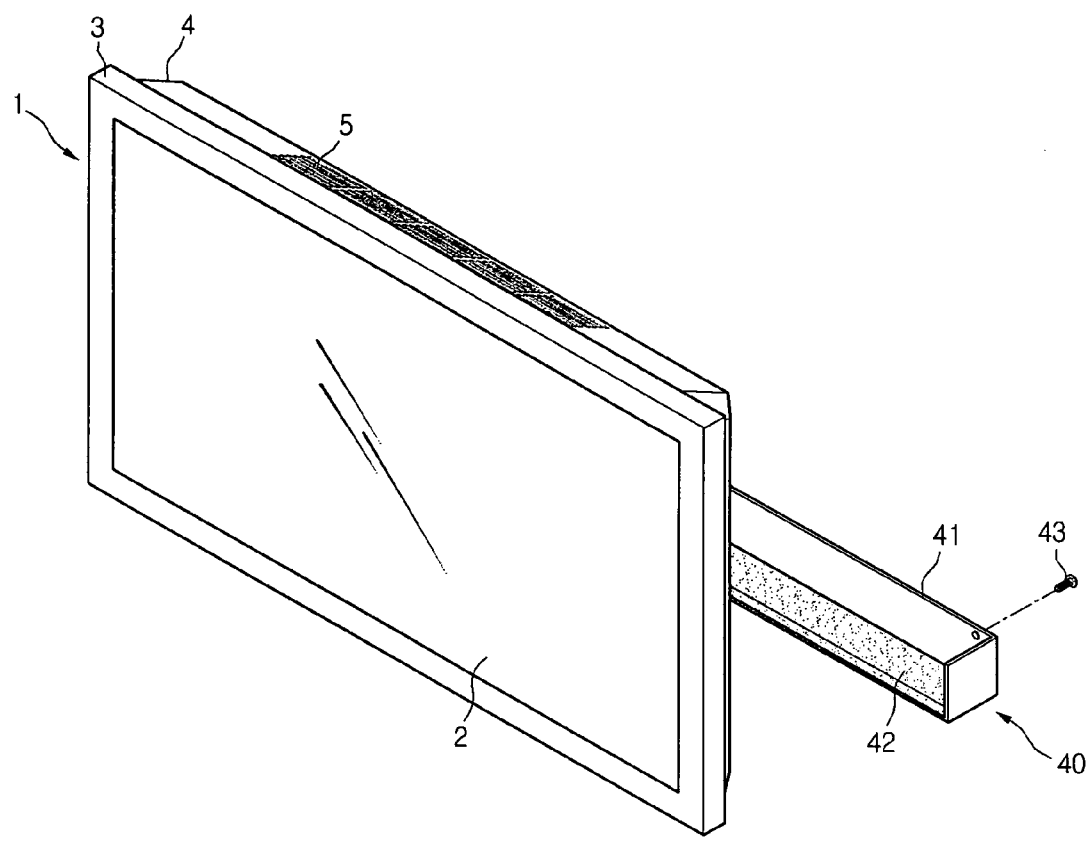
FIG. 6 is a view explaining a filter is not provided to the inside of a flat display device but independently provided as a separated part according to another embodiment of the present invention.

FIG. 6 illustrates another embodiment of the present invention where the filter is not provided in a flat display device but is independently provided as a separate part.

Referring to FIG. 6, a separate filter assembly 40 is provided at the bottom of a flat display device 1 and is coupled to the rear of a back cover 4. The filter assembly 40 includes a filter support 41 with a bent section and a filter 42 safely seated on the filter support 41. The filter assembly 40 is coupled to the back cover 4 by screws 43. Although not illustrated, it is natural that the filter support 41 aligned with the filter 42 is entirely opened or has a plurality of openings such that an external air flows toward the filter 42.

According to this structure, it is natural that the filter 42 blocks the outside of the air inlet 16 and filters off foreign substances from air flowing in through the air inlet 16, thereby enhancing the purity of the inflow air.

According to this embodiment, the filter assembly 40 may be selectively attached depending on whether the filter 42 is necessary. Therefore, when the filter 42 is unnecessary, it is possible to reduce the airflow resistance and the corresponding power that may additionally consumed when the filter 42 is attached.

Alternatively, the air inlet through which the external air is introduced may be formed on an upper portion of the flat display device while the air outlet for exhausting the internal hot air may be formed on the lower portion of the flat display device. In this case, the fan is disposed close to the air outlet so that the internal hot air can be effectively exhausted to the external side.

In this case, the shield aligned with the air outlet and the driving unit for driving the shield may be omitted. That is, when the air outlet is formed on the lower portion of the flat display device, the foreign objects falling under gravity are not introduced. Furthermore, the filter is provided on the air inlet, the foreign objects are not introduced through the air inlet. Therefore, there is no need for the shield for preventing the foreign objects from introducing into the flat display device.

Alternatively, a structure of the shield and a structure for operating the shield may be modified. For example, a plurality of ribs for selectively blocking the respective slits of the air outlet and a single operating unit for operating the ribs may be provided. And a film, having a portion with a many small openings, rolled on the two rollers can be adapted to block or open the air outlet 5. Additionally, the shield can be formed in a variety of structures.

According to the present invention, since the foreign objects cannot be introduced into the flat display device, the service life of the flat display device can increase and the risk of the fire can be eliminated.

Furthermore, since there is no need to form air holes through a wide range of the cover, the strength of the flat display device is enhanced, thereby reducing the material cost.

Since the air inlet and outlet are formed in a longitudinal direction of the flat display device, the structure can be simplified and the thickness of the display device can be reduced, thereby reducing the installation space for the display device.

The cooling apparatus can improve a degree of installation free of the display device by improving an airflow direction in the flat display device.

Furthermore, even when the flat display device is installed at a public place such as a subway station where the flat display device can be easily polluted, since the foreign objects cannot be introduced into the flat display device, it can be reliably operated.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A cooling apparatus for a flat display device, comprising:
a flat display module;
a cover that protects the flat display module;
an air inlet formed on one side of the cover that introduces external air into the cover;
an air outlet formed on the other side of the cover that discharges high temperature air contained inside the cover;
a fan that forcibly directs air from the air inlet to the air outlet;
a shield positioned adjacent to the air outlet that selectively closes the air outlet to prevent inflow of foreign substances; and
a housing for the fan wherein the housing comprises a scroll disposed adjacent one side of the fan and a stabilizer disposed on another side of the fan.

2. The cooling apparatus according to claim 1, further comprising a filter that prevents foreign substances from being introduced into the cover through the air inlet.

3. The cooling apparatus according to claim 2, wherein the filter is mounted inside the air inlet.

4. The cooling apparatus according to claim 1, wherein the filter is formed on a lower peripheral portion of the cover.

5. The cooling apparatus according to claim 1, wherein the shield is configured to move in a direction parallel with respect to the air outlet.

6. The cooling apparatus according to claim 1, wherein the air outlet is formed on an upper peripheral portion of the cover.

7. The cooling apparatus according to claim 1, wherein the fan is positioned adjacent to the air outlet.

8. The cooling apparatus according to claim 7, wherein the fan is a cross-flow fan.

9. The cooling apparatus according to claim 7, wherein the shield is configured to open the air outlet when the fan operates, and close the air outlet when the fan does not operate.

10. The cooling apparatus according to claim 1, wherein the shield operates automatically.

11. The cooling apparatus according to claim 1, wherein the shield is configured to move horizontally.

12. The cooling apparatus according to claim 1, wherein the shield includes a rack formed on a surface of the shield, a pinion engaged with the rack, and a driving motor connected with the pinion.

13. The cooling apparatus according to claim 12, wherein the pinion and the motor are fixed at a predetermined location on the cover.

14. The cooling apparatus of claim 1, further comprising a shield guide configured to guide movement of the shield.

15. The cooling apparatus of claim 1, wherein the flat display module comprises one of an LCD, a FED, a PDP, or an EL.

16. The cooling apparatus of claim 1, wherein the air outlet comprises a plurality of slits provided in the cover.

17. The cooling apparatus of claim 1, wherein a predetermined gap is provided between the flat display module and an inner surface of the cover to allow air received in through the air inlet to flow through the gap and be exhausted through the air outlet.

18. The cooling apparatus of claim 1, wherein the air inlet is formed in a lower portion of the back cover and the air outlet is formed in an upper portion of the cover.

19. The cooling apparatus of claim 1, wherein the air inlet and the air outlet are formed on inclined portions of the cover.

20. A flat display device, comprising:
a flat display module;
a cover that protects the flat display module;
an air inlet formed on one side of the cover that introduces external air into the cover;
an air outlet formed on another side of the cover that discharges air contained inside the cover;
a fan positioned adjacent to the air outlet that forcibly directs air from the air inlet to the air outlet;
a filter that filters foreign substances contained in air flowing through the air inlet; and
a housing for the fan, wherein the housing comprises a scroll disposed adjacent one side of the fan and a stabilizer disposed on another side of the fan.

21. The flat display device according to claim 20, wherein the filter is positioned adjacent to the air inlet.

22. The flat display device according to claim 20, wherein the filter is positioned on an inner surface of the air inlet.

23. The flat display device according to claim 20, wherein the filter is provided as part of a filter assembly coupled at an outside of the air inlet.

24. The flat display device according to claim 20, further comprising a shield that selectively closes the air outlet.

25. A cooling apparatus for a flat display device, comprising:
a flat display module;
a cover that protects the flat display module;
an air inlet formed on one side of the cover that introduces external air into the cover;
an air outlet formed on the other side of the cover that discharges high temperature air contained inside the cover;
a fan positioned adjacent to the air outlet that allows external air to be introduced through the air inlet and forcibly directs high temperature internal air within the cover to the air outlet; a filter positioned adjacent to the air inlet that filters foreign substances flowing through the air inlet; and a housing for the fan, wherein the housing comprises a scroll disposed adjacent one side of the fan and a stabilizer disposed on another side of the fan; and wherein the air outlet is opened when the fan operates and closed when the fan stops.

26. The cooling apparatus according to claim 25, wherein the air outlet is selectively opened by a shield that operates automatically.

27. The cooling apparatus according to claim 25, wherein the filter is positioned on the inner surface of the air inlet.

28. The cooling apparatus according to claim 25, wherein the filter is provided as part of a filter assembly coupled at an outside of the air inlet.

* * * * *